(12) United States Patent
Sewell (10) Patent No.: US 8,623,588 B2
(45) Date of Patent: Jan. 7, 2014

(54) SCANNING EUV INTERFERENCE IMAGING FOR EXTREMELY HIGH RESOLUTION PATTERNING

(75) Inventor: Harry Sewell, Ridgefild, CT (US)

(73) Assignee: ASML Holding N.V., Veldhoven (NL)

( * ) Notice: Subject to any disclaimer, the term of this patent is extended or adjusted under 35 U.S.C. 154(b) by 291 days.

(21) Appl. No.: 12/810,994

(22) PCT Filed: Dec. 23, 2008

(86) PCT No.: PCT/EP2008/011057
§ 371 (c)(1),
(2), (4) Date: Jun. 28, 2010

(87) PCT Pub. No.: WO2009/083229
PCT Pub. Date: Jul. 9, 2009

(65) Prior Publication Data
US 2010/0284015 A1   Nov. 11, 2010

Related U.S. Application Data (60) Provisional application No. 61/006,185, filed on Dec. 28, 2007.

(51) Int. Cl.
*G03B 27/70* (2006.01)
(52) U.S. Cl.
USPC ............................. 430/321; 356/450; 355/66
(58) Field of Classification Search
USPC ............................. 430/321; 356/450; 355/66
See application file for complete search history.

(56) References Cited

U.S. PATENT DOCUMENTS

| | | | |
|---|---|---|---|
| 4,596,467 A | 6/1986 | Bartelt | |
| 6,882,477 B1 | 4/2005 | Schattenburg et al. | |
| 7,440,078 B2 | 10/2008 | Bleeker et al. | |
| 7,474,385 B2 | 1/2009 | Markoya et al. | |
| 7,492,442 B2 | 2/2009 | Markoya et al. | |
| 7,561,252 B2 | 7/2009 | Sewell et al. | |
| 7,751,030 B2 | 7/2010 | Markoya et al. | |
| 7,768,627 B2 | 8/2010 | Visser et al. | |
| 2004/0011092 A1 | 1/2004 | Haczynski et al. | |
| 2005/0073671 A1 | 4/2005 | Borodovsky | |
| 2006/0109532 A1 | 5/2006 | Savas et al. | |
| 2007/0153249 A1 | 7/2007 | Troost et al. | |
| 2007/0153250 A1 | 7/2007 | Sewell et al. | |
| 2007/0258078 A1 | 11/2007 | Troost et al. | |
| 2007/0279642 A1 | 12/2007 | Shmarev | |

FOREIGN PATENT DOCUMENTS

| | | |
|---|---|---|
| EP | 1 801 655 A2 | 6/2007 |
| JP | 05-175102 A | 7/1993 |

OTHER PUBLICATIONS

International Search Report mailed May 15, 2009 for International Application No. PCT/EP2008/011057, 3 pgs.
Solak H et al, "Sub-50 nm period patterns with EUV Interference Lithography", Microelectronic Engineering, Elsevier Publishers BV., Amsterdam, NL, vol. 67-68, Jun. 1, 2003, pp. 56-62.
International Preliminary Report on Patentability and Written Opinion of the International Searching Authority directed to related International Patent Application No. PCT/EP2008/011057, issued Jun. 29, 2010, from the International Bureau of WIPO; 7 pages.

*Primary Examiner* — Daborah Chacko Davis
(74) *Attorney, Agent, or Firm* — Sterne, Kessler, Goldstein & Fox P.L.L.C

(57) ABSTRACT

A system and method are provided for writing patterns onto substrates. First and second beams of extreme ultraviolet (EUV) radiation are produced. An exposure unit is used to project the first and second beams of EUV radiation onto a substrate. The first and second beams of radiation interfere with each other to expose a first set of parallel lines at an exposure field of the substrate.

24 Claims, 7 Drawing Sheets

SCANNING EUV INTERFERENCE IMAGING FOR EXTREMELY HIGH RESOLUTION PATTERNING

CROSS-REFERENCE TO RELATED APPLICATIONS

This application claims the benefit of U.S. provisional application 61/006,185, which was filed on 28 Dec. 2007, and which is incorporated herein in its entirety by reference.

BACKGROUND

1. Field of the Invention

The present invention relates to lithographic systems, and more particularly to interferometric lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which is commonly referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., photoresist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Resolution achieved by the overall semiconductor manufacturing process depends not only on the optics involved, but also on the chemical processes employed (e.g., interactions between the photoresist and the etching chemicals, etc.).

When resolutions reach nanometer scale, such as 30-100 nm, it is very difficult to use conventional masks, reticles, and patterning arrays to accomplish this. The current resolution limit of lens-based systems is approximately 45 nm.

As the wavelength of light used in a lithographic system decreases, the resolution typically improves. For example, some lithographic systems are implemented using light in the extreme ultraviolet (EUV) range. However, many of these systems suffer from poor numerical apertures, for example on the order of 0.25, that limit the resolution of these systems, for example, on the order of 26 nm line/space (L/S).

SUMMARY

Therefore, what is needed is an EUV lithography system and method that does not have a limited numerical aperture and allows for high resolution patterning.

In a first embodiment of the present invention, there is provided a method to write patterns onto a substrate comprising the following steps. First and second beams of extreme ultraviolet (EUV) radiation are produced. An exposure unit is used to project the first and second beams of EUV radiation onto a substrate. The first and second beams of radiation interfere with each other to expose a first set of parallel lines at an exposure field of the substrate.

In alternative examples, the substrate is moved relative to the first and second beams during writing of the image onto the substrate or remains stationary during writing.

Another embodiment of the present invention provides first and second exposure systems. The first exposure system is used for writing a pattern onto a substrate and is configured to receive a first beam of extreme ultraviolet (EUV) radiation and direct the first beam onto an exposure field on a substrate. The second exposure system is configured to receive a second beam of extreme ultraviolet (EUV) radiation and direct the second beam onto the exposure field on the substrate. The first exposure system includes a first beam width adjusting system and the second exposure system includes a second beam width adjusting system. The first and second beam width adjusting systems are configured to adjust widths of the first and second beams, respectively, such that respective path lengths of the first and second beams are substantially matched when they reach the exposure field to ensure the first and second beams are substantially mutually spatially and temporally coherent across a full width of the exposure field.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Exemplary Interferometric Lithography Systems

Figure 1:
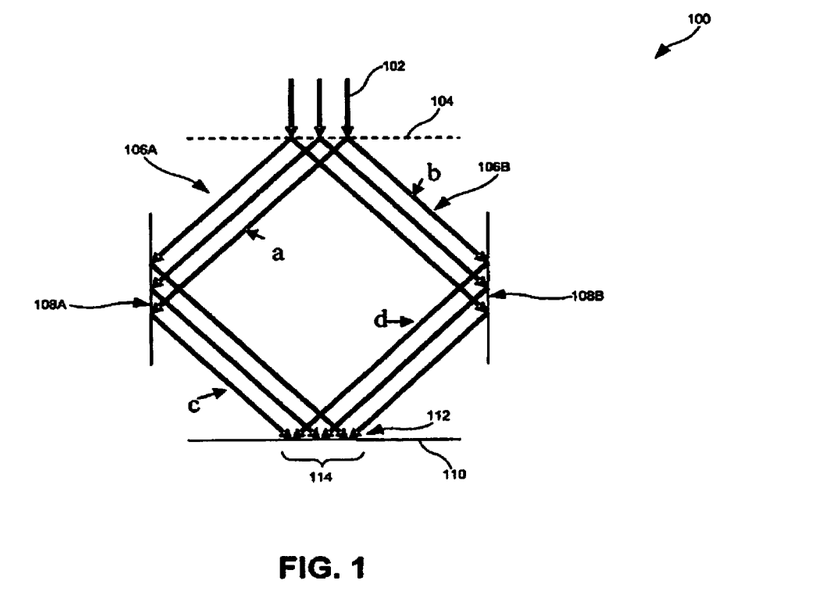
FIGS. 1 and 2 illustrate exemplary Talbot interferometric patterning systems.

FIG. 1 illustrates an interferometric lithographic system 100, commonly known in the art as a Talbot interferometer. A substantially spatially and temporally coherent light beam 102, for example generated by a laser (not shown), is incident on a beam splitter 104 (e.g., a diffractive device, a diffraction grating, a phase shifting beam splitter, or the like). Beam splitter 104 separates beam 102 into first and second beams 106A and 106B. The two beams 106A and 106B are then redirected by first and second reflecting surfaces 108A and 108B, respectively, towards a substrate 110 (e.g., a workpiece, a display, or the like, hereinafter referred to as a substrate). Each path from beam splitter 104 to substrate 110 (e.g., a+c or b+d) is sometimes referred as an "arm" of the interferometer 100. Exemplary conventional Talbot interferometers include U.S. Pat. Nos. 6,882,477 and 4,596,467 and U.S. Published Patent Application Nos. 2004-011092-A1 and 2005-0073671, which are all incorporated by reference herein in their entireties.

An interference pattern 112 is formed at a top surface of substrate 110. For example, when used for lithography, interference pattern 112 exposes a photoresist layer (not labeled in FIG. 1) with a writing image. For example, first and second beams 106A and 106B can be projected onto substrate 110 to interfere to expose a plurality of lines on substrate 110, corresponding to lines of maxima caused by constructive interference between the beams of radiation 106A and 106B, separated by minima caused by destructive interference between the two beams of radiation 106A and 106B.

It is to be appreciated that substrate 110 can be located on a stage or table (not shown) that allows for movement of substrate 110 with respect to the writing image, e.g., scanning, stepping, or the like, to allow for patterning of an entire surface of substrate 110. In another example, substrate 110 can be stationary during imaging of substrate 110.

In one example, beam splitter 104 produces only first diffraction order beams as beams 106A and 106B. In various examples, beam splitter 104 can be a phase shifting, alternating phase shifting, binary phase shifting, or another type of beam splitter, as would apparent to a skilled artisan upon reading this description.

In one example, beam 106A has a path length a between beam splitter 104 and reflecting surface 108A, while beam 106B has a path length b between beam splitter 104 and reflecting surface 108B. Similarly, beam 106A has a path length c between reflecting surface 108A and substrate 110, while beam 106B has a path length d between reflecting surface 108B and substrate 110. In the example shown, Talbot interferometer 100 is generally referred to as a substantially symmetrical system because a+c=b+d, which produces substantially uniform fringes 112 across an exposure field 114, which is desirable.

In one example, coherent radiation 102 is produced by an illuminator (not shown) that receives a radiation beam from a radiation source (not shown). In one example, the radiation source can provide radiation having a wavelength of at least 5 nm, e.g., at least 10 nm, at least 13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by the radiation source has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used.

The source and the lithographic apparatus can be separate units or subsystems, for example when the source is an excimer laser. In such cases, the source is not considered to form part of the lithographic apparatus and the radiation beam is passed from the source to an illuminator with the aid of a beam delivery system comprising, for example, suitable directing mirrors and/or a beam expander.

Figure 2:
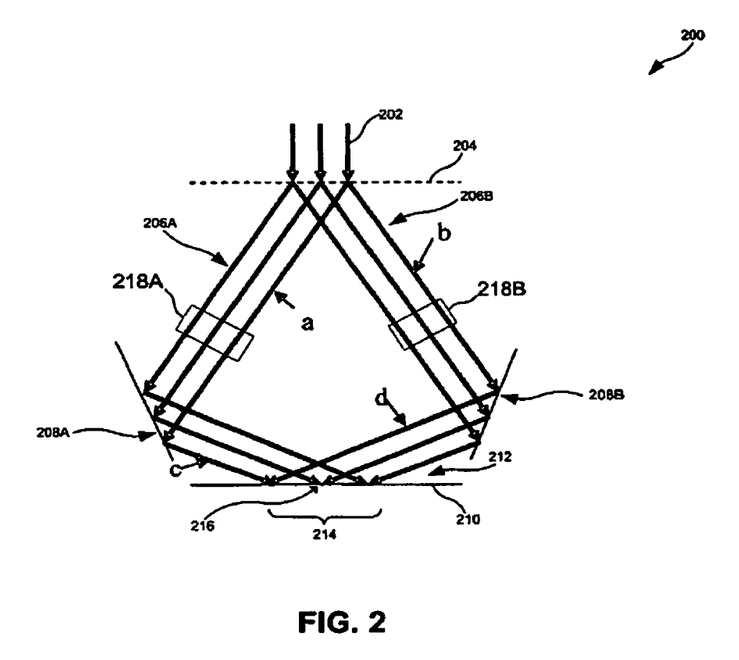

FIG. 2 illustrates another interferometric lithographic system 200. A spatially and temporally coherent light beam 202 is incident on a beam splitter 204. In one example, beam 202 can be formed from a similar illumination and/or radiation system as described above for beam 102. Beam splitter 204 separates the beam 202 into first and second beams 206A and 206B. In one example, beam splitter 204 produces only first diffraction order beams as beams 206A and 206B. The two beams 206A and 206B are then redirected by first and second reflecting surfaces 208A and 208B, respectively, towards a substrate 210. An interference pattern 212 is formed at a top surface of substrate 210. Again, in a lithographic example, the interference pattern 212 exposes a photoresist layer (not labeled in FIG. 2) across an exposure field 214. Beams 206A and 206B and substrate 210 can be moved with respect to each other, as described above, or remain stationary.

Reflecting surfaces 208A and 208B in FIG. 2 are oriented in positions that allow for a larger angle of incidence on substrate 210, as compared to the orientation of reflecting surfaces 108A and 108B in FIG. 1. The larger angle of incidence allows for an increased resolution in patterns formed on substrate 210 by fringes 212 as compared to patterns formed on substrate 110 by fringes 112.

In one example, beam 206A has a path length a between beam splitter 204 and reflecting surface 208A, while beam 206B has a path length b between beam splitter 204 and reflecting surface 208B. Similarly, beam 206A has a path length c between reflecting surface 208A and substrate 210, while beam 206B has a path length d between reflecting surface 208B and substrate 210. In the example shown, the interferometer 200 may be referred to as a non-symmetrical system because a+c≠b+d, which may produce substantially non-uniform fringe pattern 212 across an exposure field 214, which is undesirable. For example, although interference fringes are well formed and high contrast at a center position 216, moving away from center position 216 in either direction causes a differential in beam path length and an image contrast value due to loss of temporal coherence in beams 206A and 206B. Beams 206A and 206B do not properly interfere across their entire width, only at the center 216 of the exposure field 214. Thus, at high resolutions in an interference fringes 212 across field 214 producing the image may not be of consistent contrast, i.e., there is a maximum contrast ratio at center 216 of exposure field 214. Therefore, only part of fringes 212 may produce an optimum image.

Since the interferometer 200 is a non-symmetrical system, there can be a problem with coherency matching over the full width of exposure field 214. There are two types of coherence that are typically of concern for this type of imaging: (1) spatial coherence (i.e., space/position based) and (2) temporal coherence (i.e., time based), which are discussed in more detail below. In general, the concept of coherence is related to the stability, or predictability, of phase. Rays at substrate position emulate from the same position on the beam splitter 204.

Spatial coherence describes the correlation between light beams at different points in space. Spatial coherence is described as a function of distance, i.e., spatial coherence is the maintenance of a fixed-phase relationship across the full diameter of a cross section of a beam.

Temporal coherence describes the correlation or predictable relationship between light beams observed at different moments in time. In optics, temporal coherence is measured by combining beams from the same source, but having a known path length difference, and observing the interference pattern produced. In one example, a temporal coherence length is calculated by dividing a wavelength squared by the bandwidth of the beam.

In one example, coherency matching (temporal coherence) can become mismatched because the beam angles at beam splitter 204 are not the same as at the angles at substrate 210, which results in the non-symmetrical path lengths (e.g., a+c≠b+d). For example, the angles are the same for Talbot interferometer 100 based on the fact it has fully symmetric path lengths. This results in fringes 112 from the two interfering laser beams 106A and 106B being equal at all points across the exposure field 114. However, the angles are not the same for Talbot interferometer 200 based on the fact Talbot interferometer 200 does not have fully symmetric path lengths for the two interfering beams 206A and 206B. This can result in fringe contrasts differing by an increasing amount as beams 206A and 206B are displaced from center 216 of field 214. In one example, cases of very high resolution imaging may only be able to utilize the central band in the middle 216 of field 214 for imaging, which decreases the size of an allowable portion of field 214 for imaging, decreasing throughput.

To equalize path lengths in interferometric lithographic system 200, beam width adjusting systems 218A and 218B may be inserted in paths a and b, respectively. Beam width adjusting systems 218A and 218B are configured to adjust the beam widths of beams 206A and 206B, respectively, such that the path lengths of the beams 206A and 206B are matched when they reach exposure field 214 to ensure that beams 206A and 206B are mutually spatially and temporally coherent across a full width of exposure field 214. For more information regarding beam width adjusting systems 218A and 218B, please see, for example, U.S. Published Patent Application No. 2007/0153250, entitled "Interferometric Lithography System and Method Used To Generate Equal Path Lengths Of Interfering Beams," filed Dec. 29, 2005, which is incorporated herein by reference in its entirety.

Interferometric lithographic systems 100 and 200 are primarily lens based systems and therefore may not be optimal for printing patterns on substrate when extreme ultraviolet (EUV) radiation is used to expose a substrate or workpiece. Furthermore, lithographic systems that do use EUV radiation have limited numerical apertures (e.g., approximately between 0.25-0.4 without suffering from obscuration effects) that limit their resolution (e.g., approximately 26 nm lines/space (L/S)). Moreover, these EUV systems are also limited by the number of mirrors used. Since mirrors are often not highly efficient (e.g., efficiencies of approximately 66%), as the number of mirrors in the system increases, performance decreases severely.

Exemplary EUV Interferometric Embodiments

Figure 3:
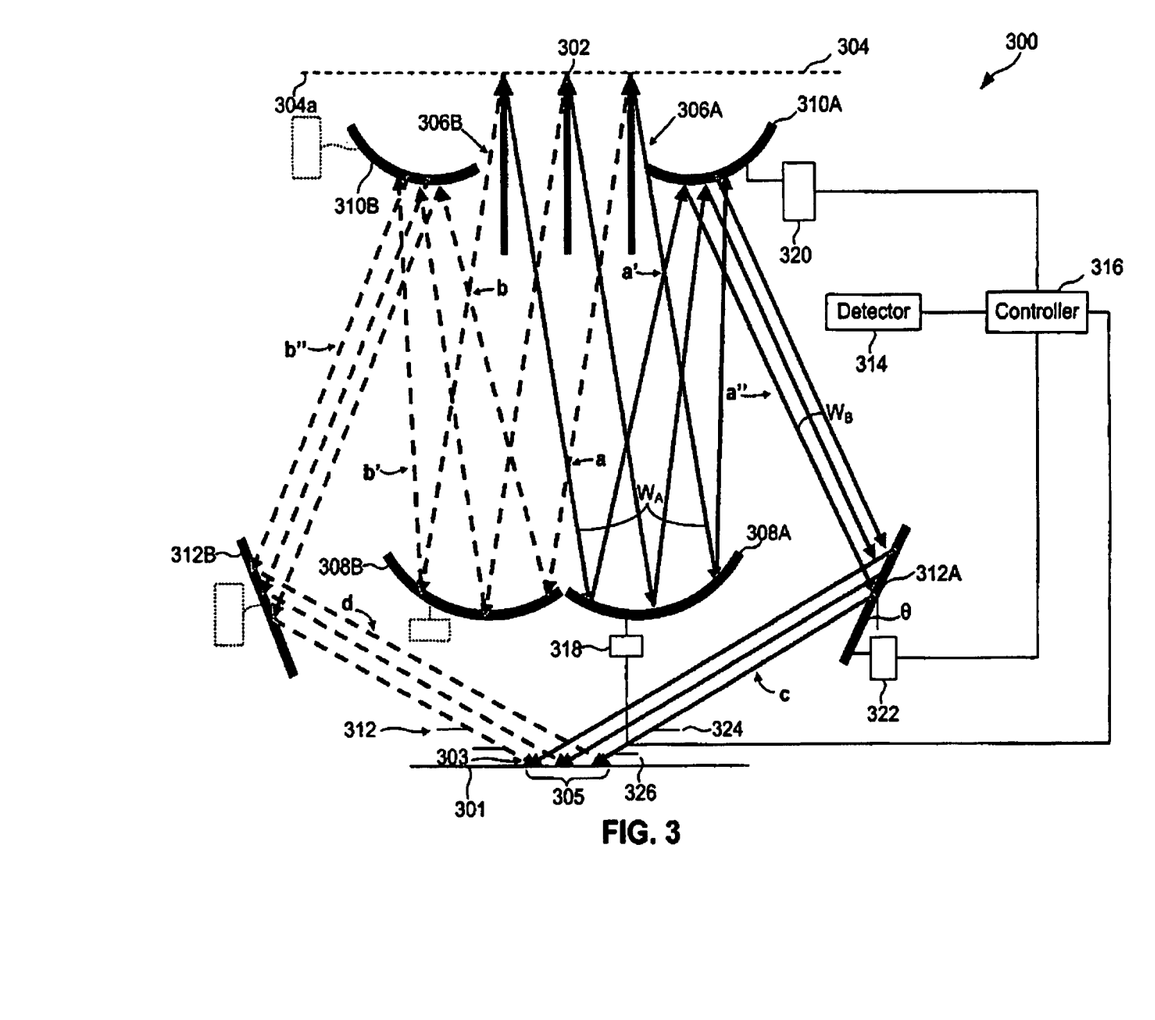
FIG. 3 illustrates an EUV interferometric patterning system.

FIG. 3 shows an interferometer 300 that includes a beam splitter 304, concave mirrors 308A and 308B, convex mirrors 310A and 310B, and flat mirrors 312A and 312B. For example, optical elements 308A, 310A, and 312A can be a first exposure system, and optical elements 308B, 310B, and 312B can be a second exposure system. Mirrors 308A-312A and 308B-312B may be formed on a low-expansion glass that prevents expansion due to heat generated by incident radiation and may be formed out of alternating layers of molybdenum and silicon. In an embodiment, such mirrors have an efficiency of approximately 66%. A coherent beam of EUV 302 radiation is incident on a beam splitter 304. Beam 302 may be generated by a synchratron or conventional plasma source, such as laser oblation or High Energy Electrical Discharge. Beam splitter 304 splits beam of EUV radiation 302 into first beam 306A and second beam 306B. First beam 306A is reflected by concave mirror 308A and convex mirror 310A onto flat mirror 312A, which directs beam 306A onto a substrate 301. Similarly, second beam 306B is reflected by concave mirror 308B and convex mirror 310B onto flat mirror 312B, which directs beam 306B onto substrate 301. In an embodiment, substrate 301 is substantially similar to substrate 110 described with reference to FIG. 1 or substrate 210 discussed with reference to FIG. 2. Substrate 301 is normally positioned in a focal plane of interferometer 300, and an interference pattern 303 is formed at a top surface of substrate 301. In a lithographic example, interference pattern 303 exposes a photoresist layer (not labeled in FIG. 3) across an exposure field 305. Again, it is to be appreciated that substrate 301 can be located on a stage, table, or the like (not shown) that allows for movement of substrate 301 with respect to the writing image to allow for patterning of an entire surface of substrate 301 using different techniques, as would be apparent to a skilled artisan upon reading and understanding this description. Alternatively, substrate 301 can remain stationary.

As shown in FIG. 3, interferometer 300 is a reflection based or mirror based system. For example, and in contrast to beam splitters 104 and 204 described with reference to FIGS. 1 and 2, respectively, beam splitter 304 is a reflective beam splitter. Therefore, as shown in FIG. 3, beam 302 is incident on a surface 304a of beam splitter 304 that faces substrate 301 instead of the surface that faces away from substrate 301, as in systems 100 and 200. To allow for beam 302 to be incident on surface 304a of beam splitter 304 without interfering with substrate 301 and/or elements of interferometer 300, beam 302 is incident on beam splitter 304 at an angle not parallel to a plane that includes a normal vector of substrate 301 (not shown). In other words, beam 302 is not parallel to the plane of the sheet of paper that shows FIG. 3. This allows beam 302 to avoid interaction with substrate 301 and elements of interferometer 300, while still being incident on surface 304a of beam splitter 304.

In an embodiment, beam 302 is incident on the plane that includes the normal vector of substrate 301 at an angle of approximately 6 degrees.

In an embodiment, beam splitter 304 is a diffractive device that includes a group of lines. In such an embodiment, the lines may be configured so that they are perpendicular to beam 302, such that shadowing that may be caused by a topography of beam splitter 304 is substantially reduced or eliminated.

In an embodiment, concave mirror 308A and convex mirror 310A form a first beam width adjusting system and concave mirror 308B and convex mirror 310B form a second beam width adjusting system which are similar to beam width adjusting systems 218A and 218B, respectively, described with reference to FIG. 2. However, in contrast to beam width adjusting systems 218A and 218B that are lens based systems, the beam width adjusting systems formed by mirrors 308A, 308B, 310A, 310B are mirror based systems so that they can accommodate EUV radiation. Thus, interferometer 300 includes first and second exposure systems that include the first and second beam width adjusting systems, respectively, and flat mirrors 312A and 312B, respectively.

Beam 306A is incident onto concave mirror 308A with a width $w_A$ and leaves convex mirror 310A with a width $w_B$. Beam 306B is also incident on concave mirror 308B and leaves convex mirror 310B with the same widths (not shown). A demagnification ratio, M, of the beam width adjusting systems can be expressed as $$M = \frac{w_A}{w_B}.$$

The value of M is determined by the respective curvatures of mirrors 308A, 308B, 310A, 310B. In an embodiment, the curvatures of mirrors 308A, 308B, 310A, and 310B are chosen such that respective path lengths of beams 306A and 306B are substantially equal when they reach exposure field 305 to ensure beams 306A and 306B are mutually spatially and temporally coherent across a full width of exposure field 305. Beam 306A has a length a between beam splitter 304 and concave mirror 308A, a length a' from concave mirror 308A to convex mirror 310A, a length a" between convex mirror 310A and flat mirror 312A, and a length c between flat mirror 312A and substrate 301. Similarly, beam 306B has a length b between beam splitter 304 and concave mirror 308B, a length b' from concave mirror 308B to convex mirror 310B, a length b" between convex mirror 310B and flat mirror 312B, and a length d between flat mirror 312B and substrate 301. The curvatures of mirrors 308A, 308B, 310A, and 310B, are chosen such that (a+a'+a")+c=(b+b'+b")+d, so that substantially uniform fringes 303 are formed across the entirety of exposure field 305.

Furthermore, interferometer 300 may optionally include a dynamic beam width adjustment through use of actuators 318, 320, and 322 coupled to concave mirror 308A, convex mirror 310A, and flat mirror 312A, respectively, and a controller 316. Controller 316 is coupled to a detector 314. Detector 314 is configured to sense the contrast of the fringes of interference pattern 303 formed on substrate 301, and produce a signal indicative of the sensed contrast. Controller 316 receives signal generated by detector 314 and generates a control signal indicative of an adjustment of a position and/or orientation of concave mirror 308A and/or convex mirror 310A that will increase the contrast of the fringes of interference pattern 303. Actuators 318 and 320 receive control signal and adjust the position, shape, and/or orientation of concave mirror 308A and/or convex mirror 310A, respectively. For example, concave mirror 308A and/or convex mirror 310A can be deformable mirrors, as is known in the art. For example, controller 316 may determine that the contrast of the fringes of interference pattern 303 can be increased by moving concave mirror 308A by a determined distance or deforming concave mirror 308A by a predetermined amount. In such an embodiment, controller 316 generates a corresponding control signal that is received by actuator 318. Actuator 318 then adjusts the position or shape of concave mirror 308A by the determined distance or amount.

A pitch of features (e.g., lines) formed on substrate 301 at least partially depends on an angle θ of flat mirror 312A. In order to adjust the pitch of the lines foamed on substrate 301, then, controller 316 may also be configured to output a second control signal. Actuator 322 receives the second control signal and adjusts the tilt of flat mirror 312A (e.g., adjusts θ) accordingly. In a further embodiment, tilting flat mirror 312A results in a fine adjustment of the pitch of the lines formed on substrate 301. Controller 316 may also operate to coarsely adjust the pitch of formed lines. Specifically, controller 316 may be configured to generate a third control signal that is received by actuators 318 and 320. In response to the third control signal, actuators 318 and/or 320 either replace or interchange concave mirror 308A and/or convex mirror 310A, with another mirror that has a different curvature or change a curvature of concave mirror 308A and/or convex mirror 310A. For example, to coarsely adjust the pitch of a line, controller 316 may generate a signal received by actuator 318. In response, actuator 318 may replace or interchange concave mirror 308A with another concave mirror that has a different curvature or change a curvature of concave mirror 308A. Furthermore, controller 316 along with actuators 318A 318 and/or 320 may be also be configured to readjust the position, shape, and/or orientation of the elements of interferometer 300 (e.g., the mirror that replaced concave mirror 308A and/or convex mirror 310A) so that temporal and spatial coherence is maintained.

The above embodiments regarding controller 316 have been described with respect to mirrors 308A, 310A, and 312A and actuators 318-322. However, actuators coupled to mirrors 308B, 310B, and 312B (shown in dotted lines) may also be configured in a similar manner. The actuators coupled to mirrors 308B, 310B, and 312B may be coupled to controller 316 and receive control signals generated by it or may be coupled to a second controller (not shown) that generates another set of similar control signals.

After beams 306A and 306B are reflected by flat mirrors 312A and 312B, respectively, they may expose substrate 301 through an optional slit, 324. In an embodiment, slit 324 is substantially rectangular, so that a rectangle is formed on substrate 301. However, in alternate embodiments, interferometer 300 may not include a slit and beams 306A and 306B may expose all or substantially all of substrate 301. Thus, interferometer 300 may be configured to expose a set of parallel lines by exposing a rectangle (or other shape, based on the shape of slit 324) and moving substrate 301 under slit 324 so that the set of lines is formed. Alternatively, interferometer 300 may not include slit 324, but rather the first and second beam width adjustment systems, along with flat mirrors 312A and 312B, may be configured so that beams 306A and 306B form interference pattern 303 on substrate 301, such that a set of lines are formed. The embodiment in which interferometer 300 includes slit 324 is described in more detail with respect to FIG. 4.

Interferometer 300 also optionally includes a trimming aperture 326. Trimming aperture 326 is configured to block a portion of beams 306A and 306B from exposing substrate 301. In a further embodiment, trimming aperture 326 is configured block scattered radiation from exposing substrate 301. Scattered radiation, if not blocked, may expose generally random portions of substrate 301 and degrade the resolution of the image formed by interferometer 300 on substrate 301.

Additionally, or alternatively, interferometer 300 can be used to perform grid based lithography, discussed below with respect to FIGS. 5A-5C and 6A-6C. In grid based lithography, once a first set of parallel lines are exposed, substrate 301 can then be rotated by 90 degrees and a second set of parallel lines can be exposed. The second set of lines are substantially perpendicular to the first set of parallel lines. Thus, by printing two sets of parallel lines perpendicular to each other, a grid can be formed. The grid can then be trimmed into a desired pattern through additional exposures. Grid based lithography, then, allows for utilization of a device (e.g., interferometer 300) that has a relatively high numerical aperture (e.g., approximately 0.9 compared to approximately 0.4 for other EUV systems) and that can form very fine parallel lines (e.g., 4 nm (L/S) with EUV radiation that has a wavelength of approximately 13 nm) to be used as the basis for creating fine patterns.

Moreover, as shown in FIG. 3, interferometer 300 can increase illumination efficiency by only having three mirrors in each beam path, as opposed to other EUV lithography systems that may include six or more mirrors in each beam path. The increase in illumination efficiency is because, as described above, mirrors typically are inefficient, thus using only three mirrors represents a substantial improvement over existing EUV systems.

Figure 4:
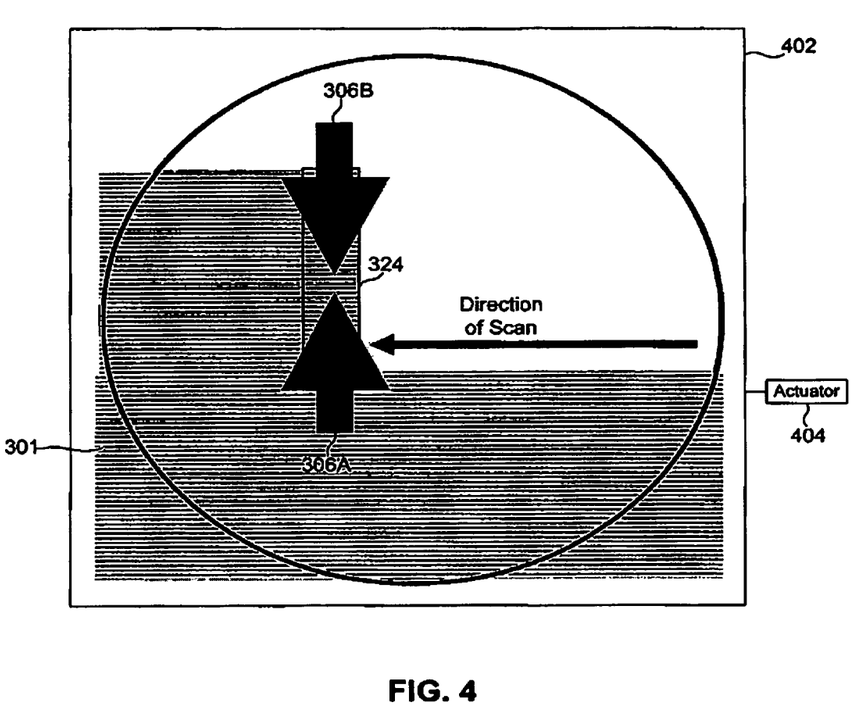
FIG. 4 shows a top view of a slit.
Figure 6A:
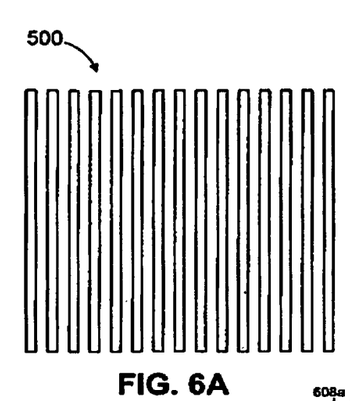
FIGS. 6A-6C shows exemplary processing steps for grid based lithography.
Figure 6B:
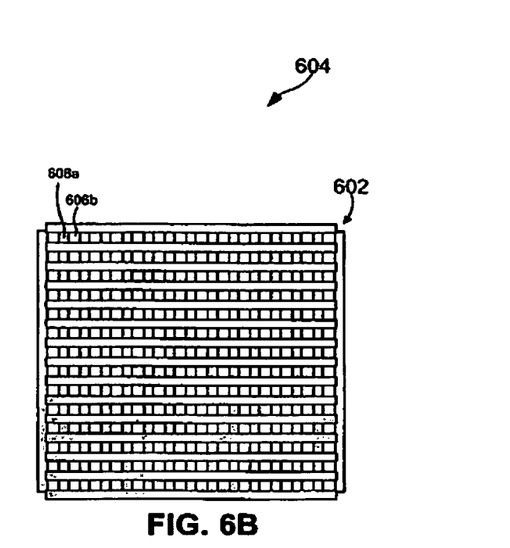
Figure 6C:
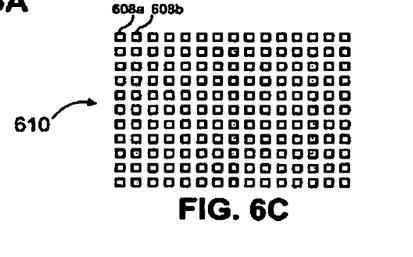

FIG. 4 shows a top view of slit 324 configured to receive beams 306A and 306B, according to an embodiment of the present invention. Beams 306A and 306B pass through slit 324 so that they are used to expose parallel lines on substrate 301. As shown in FIG. 4, slit 324 is substantially rectangular. Thus, by exposing slit 324, one or more rectangles are formed on substrate 301. An actuator 402 coupled to a stage 404 is configured to move substrate 301 relative to interfering beams 306A and 306B so that one or more lines are formed. In such a manner, a group of parallel lines can be exposed on substrate 301. Moreover, actuator 402 and stage 404 may also be configured to rotate substrate 301 so that another set of parallel lines can be exposed that are substantially perpendicular to an initial set of parallel lines, as shown in FIGS. 6A-6C discussed below.

Additionally, or alternatively, double patterning can be performed using the systems of FIGS. 3 and 4. Through double patterning, actuator 402 and stage 404 may also be configured to move substrate 301 such that a second group of parallel lines are formed after the originally formed parallel lines. The second group of parallel lines may be formed between the first group of parallel lines. In an embodiment, such a double patterning may double the resolution of an exposure apparatus.

Figure 5A:
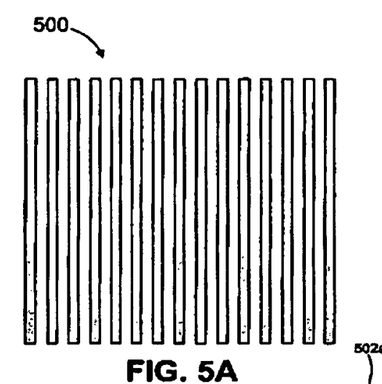
FIGS. 5A-5C illustrate example processing steps to form a trimmed exposure.
Figure 5B:
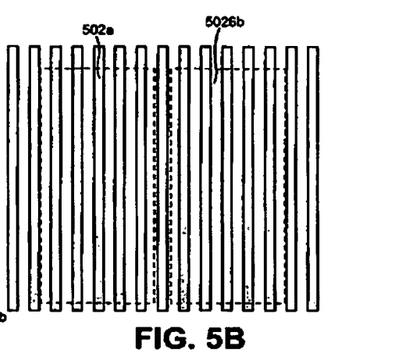
Figure 5C:
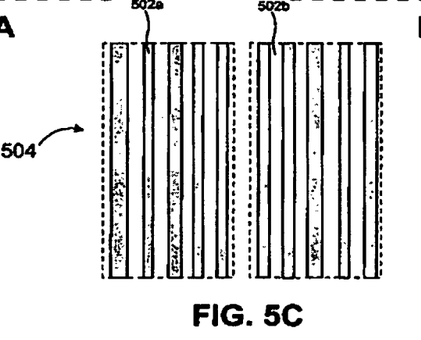

In another embodiment, a group of parallel lines may be trimmed to form a set of desired features on a substrate (not shown). FIGS. 5A, B, and C illustrate example processing steps to form a trimmed exposure, according to an embodiment of the present invention. In FIG. 5A, parallel lines 500 are formed on the substrate. In an embodiment, interferometer 300, described with reference to FIG. 3, can be used to form parallel lines 500. In FIG. 5B, regions 502a and 502b are selected as being the features desired in a final pattern. Regions 502a and 502b are shown in FIG. 5B to be substantially rectangular. However, as would be apparent to the skilled artisan, regions of different types of shapes can be selected. In FIG. 5C, regions outside of selected regions 502a and 502b are then exposed, leaving only selected regions 502a and 502b remaining in a final pattern 504.

In grid-based lithography, a grid is formed on a substrate (not shown) and specific patterns are then formed from the grid. FIGS. 6A, B, and C show exemplary processing steps for grid based lithography, according to an embodiment of the present invention. FIG. 6A shows parallel lines 500 formed on the substrate. As described above, parallel lines 500 may be formed by interferometer 300. In FIG. 6B, the substrate is then rotated 90 degrees relative to the exposure apparatus and a second set of parallel lines 602 are formed to form a grid 604. The lines of the second set of parallel lines are substantially perpendicular to parallel lines 500. A region is then selected from grid 604. In FIG. 6C, similar to the trimming described with reference to FIG. 5C, regions outside of selected region are then exposed. Moreover, regions within the selected region may also exposed. For example, the selected region may include portions of adjacent columns 606a and 606b (see FIG. 6B). To form a pattern 610 that includes columns 608a and 608b separated by spaces, column 606a and other similar columns (e.g., alternating columns) may also be exposed. Such a procedure is applied to the rest of the columns of the selected region to finally form pattern 610.

In an embodiment, pattern 610 can be used to form a memory cell. In alternate embodiments, similar design steps, i.e., creating a grid by exposing perpendicular sets of lines and trimming the resulting grid, can also be used to implement other structures such as NAND and other logic components as well as Stacked Memory technology.

Exemplary Operation

Figure 7:
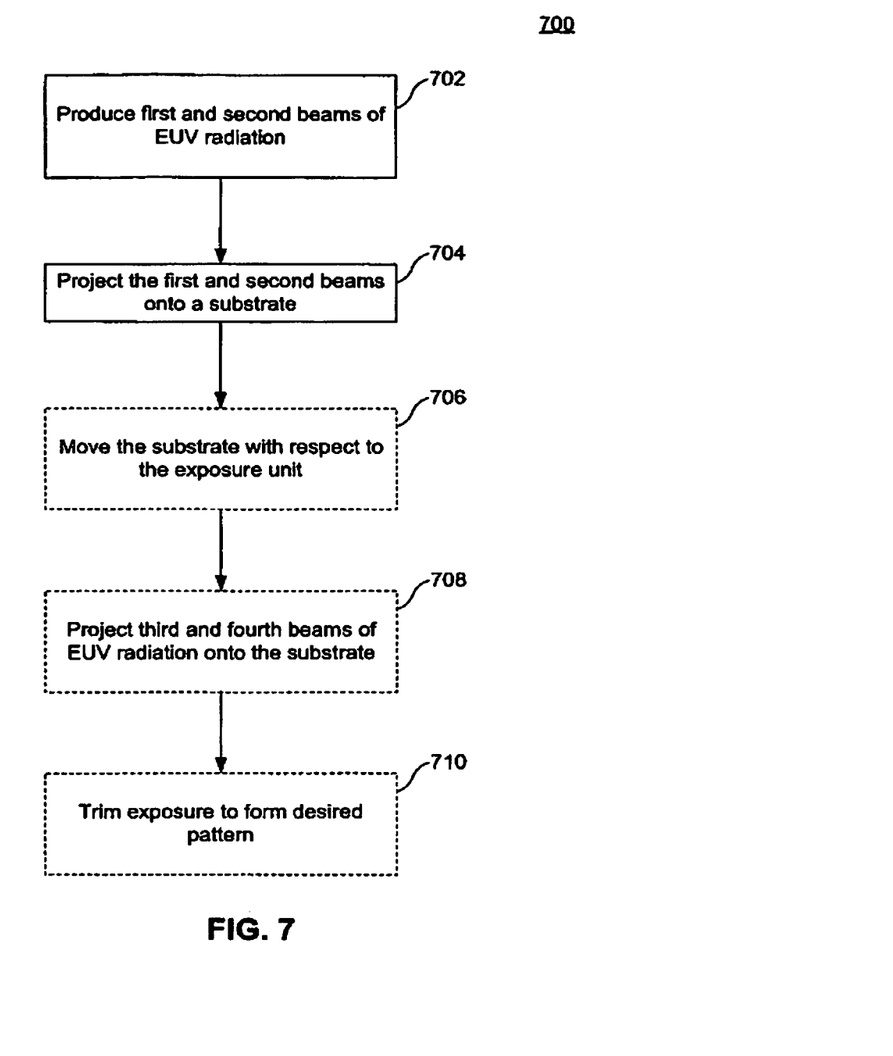
FIG. 7 shows a flowchart depicting a method, according to an embodiment of the present invention.

FIG. 7 shows a flowchart depicting a method 700. For example, a method of writing patterns onto a substrate using an interference lithography tool in FIGS. 3 and 4.

In block 702, first and second beams of EUV radiation are produced. In block 704, the first and second beams are projected on to a substrate. The first and second beams interfere such that a set of parallel lines are exposed at an exposure field of the substrate. In optional block 706, the substrate is moved with respect to the exposure unit. In optional block 708, third and fourth beams of EUV radiation are projected onto the substrate.

In an embodiment, optional blocks 706 and 708 represent a second exposure of the substrate. For example, after a set of parallel lines is formed from the first and second beams, the substrate may be moved and exposed again such that a second set of parallel lines is formed. For example, the substrate may be moved such that the second set of parallel lines are formed between respective ones of the first set of parallel lines. Additionally or alternatively, the substrate may be rotated such that another set of parallel lines are formed that are substantially perpendicular to the first set of parallel lines (e.g., by rotating the substrate by substantially 90 degrees).

In optional block 710, the exposed pattern is further trimmed to form a desired pattern. In a further embodiment, intersecting first and second sets of parallel lines may be used, through further trimming, as described with reference to FIG. 6, to form a grid that can be used as the basis for features formed on the substrate.

In the embodiments described above, the substrate is moved relative to the exposure apparatus. As would be apparent to a skilled artisan, the exposure apparatus can be additionally or alternatively moved relative to the substrate to create the patterns described above, without departing from the scope and spirit of the invention.

Although embodiments described above have made specific reference to EUV radiation, other types of radiation may also be used. For example, interferometer 300 may also use X-ray radiation. In such an embodiment, beam 302 may be an X-ray radiation beam rather than an EUV radiation beam.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example immersion lithography. The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A device manufacturing method, comprising:
using a beam splitter configured to accommodate EUV radiation to produce first and second beams from an incident extreme ultraviolet (EUV) radiation beam; and
using a mirror-based exposure unit, which includes one or more convex mirrors, one or more concave mirrors, and one or more flat mirrors, configured to accommodate EUV radiation to project the first and second beams onto a substrate, such that the first and second beams interfere with each other to expose a first set of parallel lines at an exposure field of the substrate.

2. The method of claim 1, further comprising:
rotating the substrate by an angle equal to or substantially equal to 90 degrees;
producing third and fourth beams of EUV radiation; and
using the exposure unit to project the third and fourth beams of EUV radiation onto the substrate, such that the third and fourth beams of radiation interfere with each other to expose a second set of parallel lines on respective target areas of the substrate, wherein the second set of parallel lines are substantially perpendicular to the first set of parallel lines.

3. The method of claim 2, further comprising:
trimming the pattern resulting from the method of claim 2, to form a feature.

4. The method of claim 1, further comprising:
producing third and fourth beams of EUV radiation; and
using the exposure unit to project the third and fourth beams of EUV radiation onto the substrate, such that the third and fourth beams of radiation interfere with each other to expose a second set of parallel lines on respective target areas of the substrate, wherein the second set of parallel lines are parallel to the first set of parallel lines in between respective ones of the first set of parallel lines.

5. The method of claim 1, wherein using the exposure unit comprises:
using the exposure unit to project the first and second beams of EUV radiation onto the substrate, such that the first and second beams of radiation interfere with each other to expose a rectangle on a target area of the substrate; and
moving the substrate relative to the exposure unit such that a line is exposed on the substrate.

6. The method of claim 5, further comprising:
rotating the substrate by an angle equal to or substantially equal to 90 degrees;
producing third and fourth beams of EUV radiation;
using the exposure unit to project the third and fourth beams of EUV radiation onto the substrate, such that the third and fourth beams of radiation interfere with each other to expose a second rectangle on a second target area of the substrate; and moving the substrate relative to the exposure unit such that a second line is exposed that is substantially perpendicular to the first line.

7. The method of claim 1, wherein using the exposure unit comprises:
using a first set of mirrors to direct the first beam and using a second set of mirrors to direct the second beam, such that respective path lengths of the first and second beams are substantially equal at the exposure field so that the first and second beams are substantially mutually spatially and temporally coherent across a full width of the exposure field.

8. The method of claim 7, wherein using the exposure unit further comprises:
using the first set of mirrors and the second set of mirrors to reduce, expand, or demagnify the first and second beams, respectively.

9. The method of claim 1, wherein the producing first and second beams comprises:
splitting the EUV radiation beam to produce the first and second beams.

10. The method of claim 9, wherein the producing first and second beams further comprises:
receiving the EUV radiation beam that is not parallel to a plane that includes a normal vector of the substrate,
wherein the EUV radiation beam is substantially perpendicular to a line of a beam splitter used to split the first beam, such that shadowing caused by a topography of the beam splitter is substantially reduced or eliminated.

11. The method of claim 1, wherein the producing first and second beams comprises:
diffracting the EUV radiation beam to produce the first and second beams.

12. The method of claim 1, wherein the using a beam splitter comprises using a reflective beam splitter.

13. An interferometric lithographic apparatus, comprising:
a first exposure system configured to receive a first beam of extreme ultraviolet (EUV) radiation and direct the first beam onto an exposure field on a substrate, the first exposure system including a first beam width adjusting system comprising a first convex mirror and a first concave mirror; and
a second exposure system configured to receive a second beam of EUV radiation and direct the second beam onto the exposure field on the substrate, such that the first and second beams interfere with each other to expose a first set of parallel lines at the exposure field of the substrate, the second exposure system including a second beam width adjusting system comprising a second convex mirror and a second concave mirror,
wherein the first and second beam exposure and beam width adjusting systems are mirror-based systems configured to accommodate EUV radiation, and to adjust widths of the first and second beams, respectively, such that respective path lengths of the first and second beams are substantially equal at the exposure field so that the first and second beams are substantially mutually spatially and temporally coherent across a full width of the exposure field.

14. The apparatus of claim 13, further comprising:
a detector configured to sense a contrast of fringes formed across the exposure field and generate a signal;
a controller configured to receive the signal and generate a control signal therefrom; and
an actuator configured to adjust a position, shape, or an orientation of an element of the first beam width adjusting system to increase contrast across the exposure field based on the control signal.

15. The apparatus of claim 13, further comprising:
a mirror configured to receive the first beam from the first beam width adjusting system and to reflect the first beam onto the substrate; and
an actuator configured to adjust an angle of the mirror to adjust a pitch of a line formed on the substrate.

16. The apparatus of claim 13, further comprising:
an actuator configured to interchange an element of the first beam width adjusting system or to deform the element of the first beam width adjusting in order to adjust a pitch of a line formed on the substrate.

17. The apparatus of claim 13, wherein curvatures of the first concave mirror and the first convex mirror are chosen such that substantially uniform fringes are formed across the exposure field.

18. The apparatus of claim 13, further comprising:
an actuator configured to rotate the substrate by an angle equal to or substantially equal to 90 degrees,
wherein the first and second exposure systems are configured to expose a second set of parallel lines after the substrate is rotated 90 degrees, such that the second set of parallel lines are perpendicular to the first set of parallel lines.

19. The apparatus of claim 13, wherein the first exposure system and the second exposure system are configured such that a rectangle is exposed on target areas of the substrate.

20. The apparatus of claim 13, further comprising:
an actuator configured to move the substrate, wherein the first and second exposure systems are configured to expose a second set of parallel lines, after the substrate is moved, between respective ones of the first parallel lines.

21. The apparatus of claim 20, further comprising:
a beam splitter configured to receive a third beam of EUV radiation and produce the first and second beams.

22. An interferometric lithographic apparatus, comprising:
a first exposure system configured to receive a first beam of extreme ultraviolet (EUV) radiation and direct the first beam onto an exposure field on a substrate, the first exposure system including a first beam width adjusting system;
a second exposure system configured to receive a second beam of EUV radiation and direct the second beam onto the exposure field on the substrate, such that the first and second beams interfere with each other to expose a first set of parallel lines at the exposure field of the substrate, the second exposure system including a second beam width adjusting system,
wherein the first and second beam width adjusting systems are configured to adjust widths of the first and second beams, respectively, such that respective path lengths of the first and second beams are substantially equal at the exposure field so that the first and second beams are substantially mutually spatially and temporally coherent across a full width of the exposure field; and
a reflective beam splitter having a surface, wherein the reflective beam splitter is configured and arranged to split a beam of EUV radiation into the first and second beams of EUV radiation.

23. The apparatus of claim 22, wherein the first beam width adjusting system includes a first set of mirrors and the second beam width adjusting system includes a second set of mirrors and wherein the reflective beam splitter is configured and arranged relative to the first and second set of mirrors such that the beam of EUV radiation is incident on the surface which faces the substrate.

24. The apparatus of claim 23, wherein the first set of mirrors include a first concave mirror in series with a first convex mirror and the second set of mirrors include a second concave mirror in series with a second convex mirror such that the first convex mirror is configured and arranged for reflecting substantially the first beam in its entirety away from the first concave mirror and the second convex mirror is configured and arranged for reflecting substantially the second beam in its entirety away from the second concave mirror.

* * * * *